(12) United States Patent
Vanderwees

(10) Patent No.: US 11,495,519 B2
(45) Date of Patent: Nov. 8, 2022

(54) APPARATUS FOR THERMAL MANAGEMENT OF ELECTRONIC COMPONENTS

(71) Applicant: DANA CANADA CORPORATION, Oakville (CA)

(72) Inventor: Doug Vanderwees, Mississauga (CA)

(73) Assignee: Dana Canada Corporation, Oakville (CA)

(*) Notice: Subject to any disclaimer, the term of this patent is extended or adjusted under 35 U.S.C. 154(b) by 288 days.

(21) Appl. No.: 16/894,257

(22) Filed: Jun. 5, 2020

(65) Prior Publication Data

US 2020/0388555 A1    Dec. 10, 2020

Related U.S. Application Data

(60) Provisional application No. 62/858,521, filed on Jun. 7, 2019.

(51) Int. Cl.
*H01L 23/427* (2006.01)
*H01L 23/40* (2006.01)
*F28F 3/02* (2006.01)

(52) U.S. Cl.
CPC .............. *H01L 23/427* (2013.01); *F28F 3/02* (2013.01); *H01L 23/40* (2013.01); *F28F 2215/08* (2013.01)

(58) Field of Classification Search
CPC ..... H01L 23/427; H01L 23/40; H01L 23/367; H01L 23/42; F28F 3/02; F28F 2215/08; F28F 2013/005; F28F 2013/006; F28F 3/06; H05K 7/20336; H05K 7/20445; H05K 7/20936; H05K 7/2039; F28D 15/0233
See application file for complete search history.

(56) References Cited

U.S. PATENT DOCUMENTS

| | | | |
|---|---|---|---|
| 6,158,502 A | 12/2000 | Thomas | |
| 7,755,894 B2 | 7/2010 | Yang et al. | |
| 9,640,511 B2 | 5/2017 | Hohlfeld | |
| 9,911,715 B2 | 3/2018 | Lu et al. | |
| 10,123,454 B2* | 11/2018 | Saito | H05K 7/20236 |
| 2003/0111213 A1* | 6/2003 | Chang | F28D 15/02 |
| | | | 257/E23.102 |
| 2005/0180113 A1 | 8/2005 | Shirakami et al. | |
| 2010/0059870 A1 | 3/2010 | Wen et al. | |

(Continued)

FOREIGN PATENT DOCUMENTS

| | | |
|---|---|---|
| EP | 1508916 A1 | 2/2005 |
| WO | 2020061267 A1 | 3/2020 |

*Primary Examiner* — Stephen S Sul
(74) *Attorney, Agent, or Firm* — Ridout & Maybee LLP

(57) ABSTRACT

An electronic device includes a heat-generating electronic component, a heat spreader and a heat sink. The heat spreader has an area at least about 4 times greater than the heat-generating component. A first surface of the heat spreader is in thermal contact with the first surface of the heat-generating component along a first, non-dielectric interface. The heat sink has greater mass than the heat spreader and comprises one or more layers of thermally conductive material. A first surface of the heat sink is in thermal contact with the second surface of the heat spreader along a second interface having greater area than the first interface. Dielectric thermal interface material is provided at the second interface in direct contact with the heat spreader and the heat sink, such that the second interface is dielectric.

18 Claims, 8 Drawing Sheets

(56) References Cited

U.S. PATENT DOCUMENTS

| | | |
|---|---|---|
| 2010/0224985 A1* | 9/2010 | Michael .................. H01L 24/75 |
| | | 257/E23.079 |
| 2011/0067906 A1 | 3/2011 | Kuromitsu et al. |
| 2012/0139093 A1* | 6/2012 | Start ....................... H01L 23/42 |
| | | 438/122 |
| 2014/0328016 A1* | 11/2014 | Crisp ................ H01L 23/49827 |
| | | 361/679.32 |
| 2015/0195956 A1* | 7/2015 | Linderman ............ H05K 1/181 |
| | | 363/141 |
| 2015/0301568 A1* | 10/2015 | Hill .......................... G06F 1/20 |
| | | 29/890.03 |
| 2017/0023306 A1 | 1/2017 | Stavi et al. |
| 2017/0083061 A1* | 3/2017 | Stellman ................ G06F 1/203 |
| 2017/0167800 A1* | 6/2017 | Sunada ................. H01L 23/427 |
| 2018/0027694 A1 | 1/2018 | Uchino et al. |
| 2018/0114742 A1 | 4/2018 | Noshadi et al. |
| 2018/0374716 A1* | 12/2018 | Stathakis .............. H01L 23/373 |
| 2019/0033006 A1 | 1/2019 | Vanderwees et al. |
| 2019/0074235 A1* | 3/2019 | Zou ..................... H01L 23/3677 |
| 2020/0022285 A1 | 1/2020 | Hartman et al. |
| 2020/0329551 A1* | 10/2020 | Yamamoto ......... H05K 7/20509 |

* cited by examiner

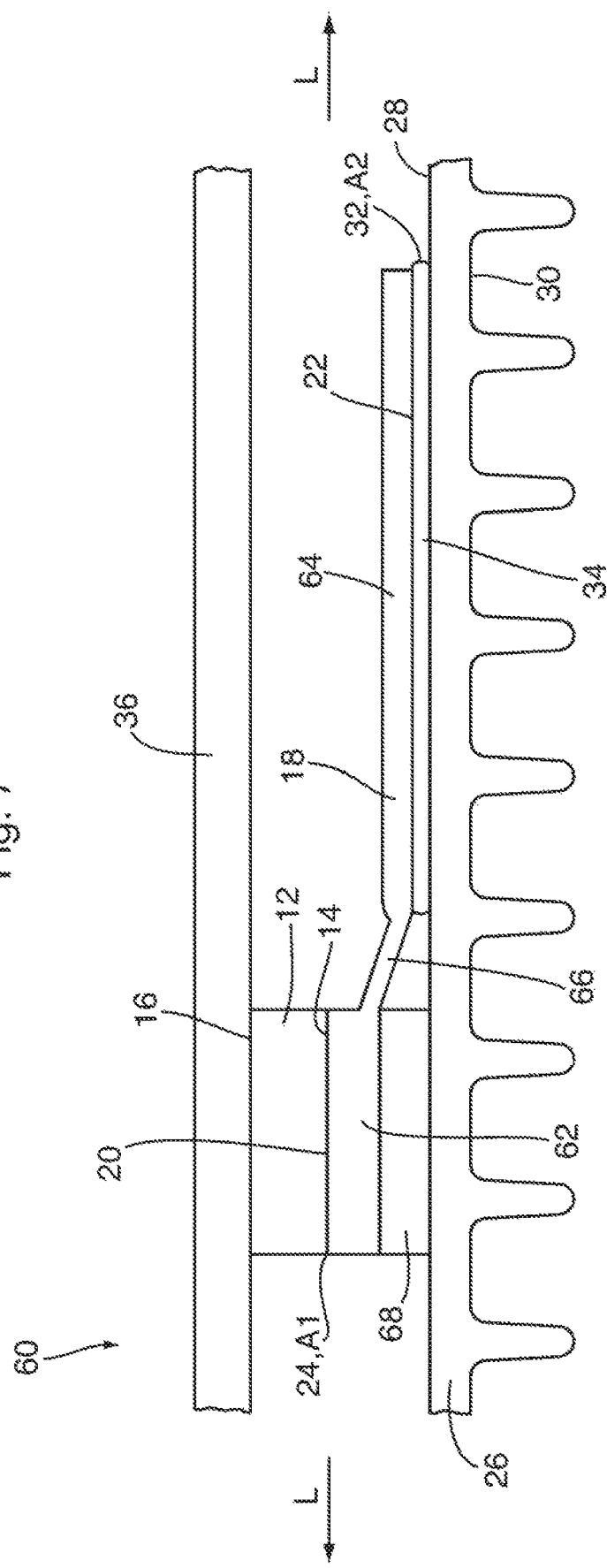

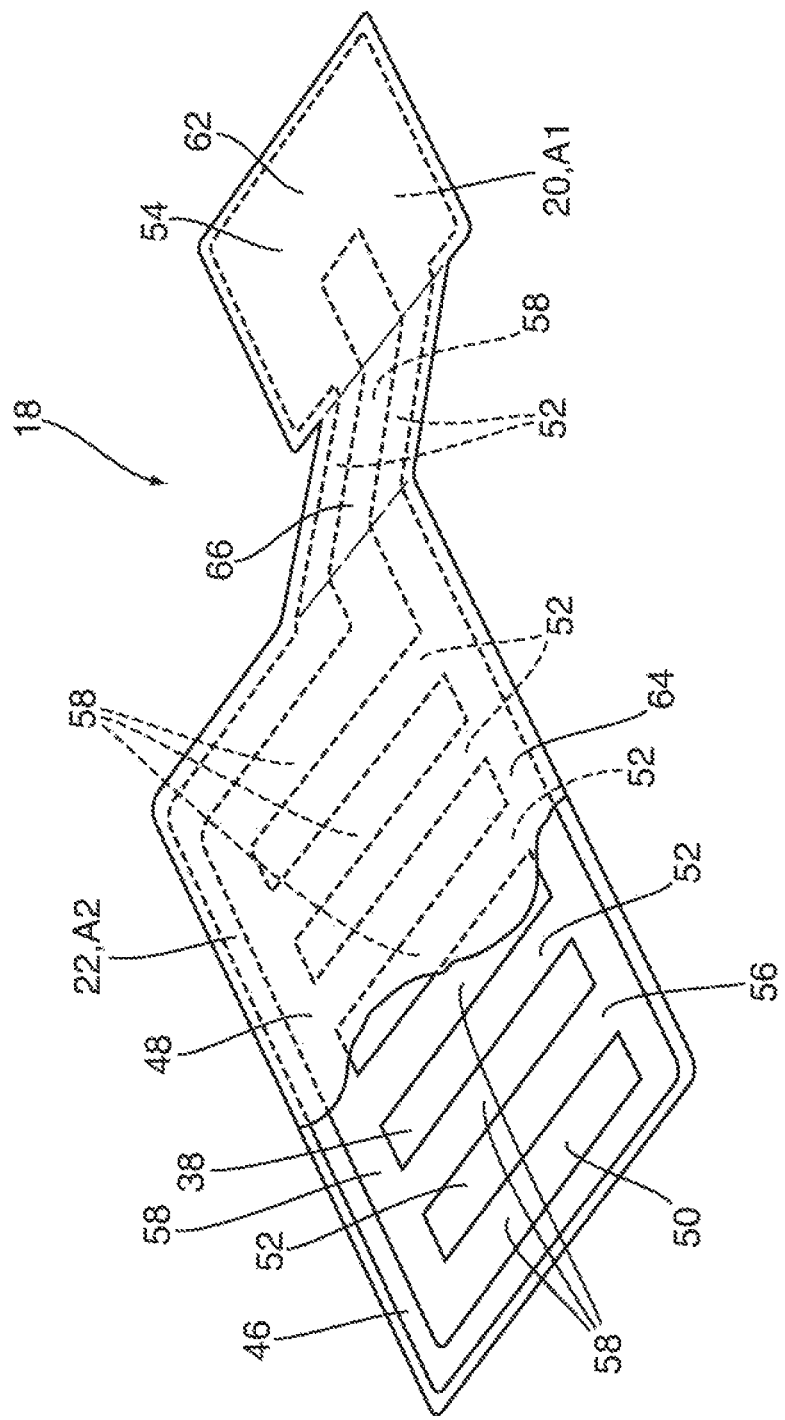

APPARATUS FOR THERMAL MANAGEMENT OF ELECTRONIC COMPONENTS

CROSS-REFERENCE TO RELATED APPLICATION

This application claims priority to and the benefit of U.S. Provisional Patent Application No. 62/858,521 filed Jun. 7, 2019, the contents of which are incorporated herein by reference.

TECHNICAL FIELD

The present disclosure relates to thermal management of heat-generating electronic components, such as computer chips in electronic devices.

BACKGROUND

Electronic devices contain heat-generating electronic components such as computer chips mounted on circuit boards. These computer chips may require cooling to avoid reduced performance and damage caused by overheating. For example, where a computer chip is near its maximum operating limit, its MTBF (Mean Time Before Failure) is reduced by 50 percent for every 10° C. increase in temperature, according to "Military Handbook, Reliability Prediction of Electronic Equipment", MIL-HDBK-2178B. Therefore, relatively moderate temperature increases can significantly reduce chip life.

A heat sink can be used to absorb and dissipate heat generated by a computer chip and/or other heat-generating electronic component in an electronic device. The heat sink can sometimes be integrated with the case or housing of the electronic device, or it may comprise a separate element such as a heat spreader which is enclosed within the case or housing. Regardless of its specific form, the heat sink is typically made from metal, having a mass and/or area significantly greater than that of the heat-generating electronic component in order to dissipate the heat. The heat sinks may include fins or other heat-dissipating elements.

Because heat sinks are comprised of metal, they must be electrically insulated from the heat-generating electronic component. Electrical insulation is typically achieved by providing a layer of dielectric, thermally conductive material between the heat-generating electronic component and the heat sink. Such materials are commonly known as "TIM" (Thermal Interface Material). The TIM layer is applied at the interface between an outer surface of the heat-generating electronic component and a surface of an immediately adjacent heat sink or heat spreader.

In addition to its role as a dielectric material, the TIM layer can enhance thermal conduction between the heat-generating electronic component and the heat sink, by filling gaps between the electronic component and the heat sink, in order to compensate for manufacturing tolerances of the components and the electronic device. The TIM layer may also provide protection from shocks and vibrations.

Because it must possess dielectric properties, the TIM layer may have relatively poor thermal properties, at least compared with the heat sink, leading to higher temperatures of the heat-generating electronic component. In addition to having poor thermal conductivity, the application of excessively thick TIM layers to compensate for manufacturing tolerances can further impair heat conduction from the heat-generating electronic component to the adjacent heat sink.

While efforts have been made to improve thermal properties of TIMs, and to reduce the thickness of TIM layers, there remains a need to improve conduction of heat between a heat-generating electronic components and a heat sink in an electronic device.

SUMMARY

In accordance with an aspect of the present disclosure, there is provided an electronic device, comprising: (a) a heat-generating component having a first surface and an opposite second surface; (b) a heat spreader having a first surface and an opposite second surface, wherein the heat spreader has an area which is at least about 4 times greater than an area of the heat generating component, wherein the first surface of the heat spreader is in thermal contact with the first surface of the heat-generating component along a first interface, and wherein the first interface is non-dielectric and defines a first interface area; (c) a heat sink having a first surface and an opposite second surface, wherein the heat sink has a greater mass than the heat spreader and comprises one or more layers of thermally conductive metal or non-metal between the first and second surfaces of the heat sink, wherein the first surface of the heat sink is in thermal contact with the second surface of the heat spreader along a second interface, wherein the second interface defines a second interface area which is greater than the first interface area; and (d) a layer of a dielectric TIM (thermal interface material) provided at the second interface and in direct contact with the second surface of the heat spreader and the first surface of the heat sink, wherein the second interface is dielectric.

According to an aspect, the heat sink has a greater area than the heat spreader, and a greater thickness, mass and area than the heat-generating component.

According to an aspect, the heat-generating component is a heat-generating electronic component, wherein the second surface of the heat-generating component faces toward a circuit board on which the heat-generating component is mounted.

According to an aspect, the first surface of the heat-generating component is flat, and wherein the area of the heat-generating component is substantially the same as the first interface area.

According to an aspect, the area of the heat spreader is about 5-100 times greater than the area of the heat-generating component.

According to an aspect, the first surface of the heat-generating component is in direct contact with the first surface of the heat spreader along said first interface, without any TIM being provided at the first interface.

According to an aspect, a layer of at material with high thermal conductivity and low dielectric strength is provided at the first interface.

According to an aspect, the layer of TIM at the second interface has a thickness from about 0.1 mm to about 0.5 mm.

According to an aspect, the heat spreader comprises a sheet or plate comprising one or more layers of thermally conductive metal or non-metal.

According to an aspect, the thermally conductive metal is aluminum or copper, and the thermally conductive non-metal is graphite.

According to an aspect, the heat spreader comprises a vapor chamber or a heat pipe.

According to an aspect, the heat spreader has a thickness of about 50-2,000 micrometers.

According to an aspect, the heat sink comprises at least a portion of a housing of the electronic device.

According to an aspect, the second surface of the heat sink comprises an external surface of the electronic device.

According to an aspect, the second surface of the heat sink is provided with a plurality of cooling fins.

According to an aspect, the first and second interfaces are spaced apart along an axis which is parallel to the first interface.

According to an aspect, the heat spreader comprises a first portion on which the first interface is defined, a second portion on which the second interface is defined, and a connecting portion which extends between and connects the first and second portions, wherein the second portion has an area which is greater than an area of the first portion.

According to an aspect, the first and second portions of the heat spreader are offset relative to one another along an axis which is perpendicular to the first interface, such that they are located in different planes.

According to an aspect, the electronic device further comprises a resilient member which exerts a compressive force to the heat-generating component and the first portion of the heat spreader at the first interface, wherein the compressive force is directed along an axis which is perpendicular to the first interface.

According to an aspect, the resilient member comprises a layer of a resilient dielectric material which is provided between, and in compressive contact with, the second surface of the heat spreader in the first portion thereof, and an adjacent surface of the electronic device.

BRIEF DESCRIPTION OF THE DRAWINGS

Exemplary embodiments of the present disclosure will now be described, by way of example, with reference to the accompanying drawings, in which:

FIG. 7 is a schematic illustration of an electronic device according to a second embodiment; and FIG. 8 is a partly cut-away perspective view of the heat spreader of the electronic device of FIG. 7, shown in isolation.

DETAILED DESCRIPTION

Figure 1:
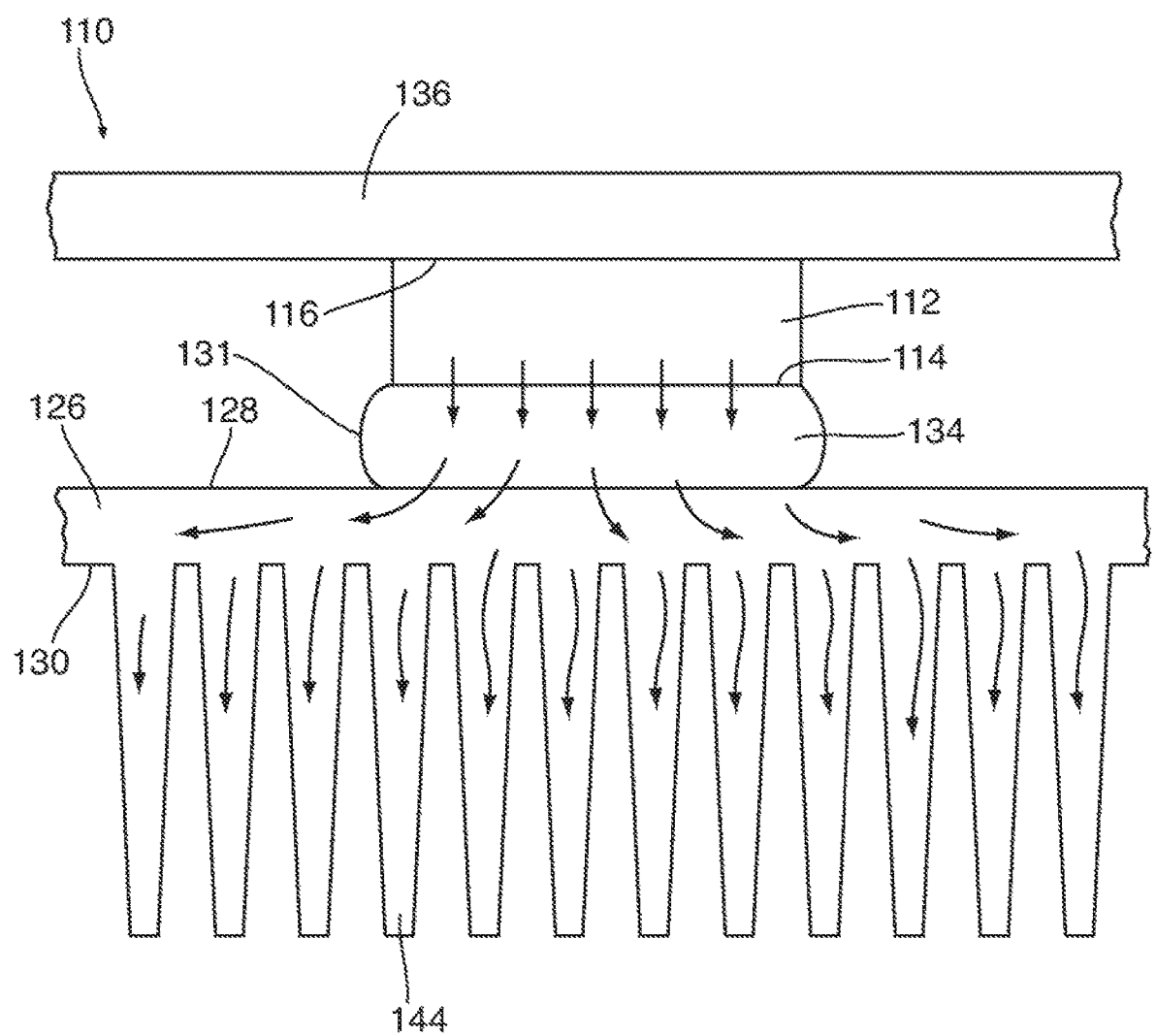
FIG. 1 is a schematic illustration of an electronic device according to the prior art.

The following description refers to drawings which are schematic representations of electronic devices and components thereof. Unless otherwise indicated in the description, it will be appreciated that the thicknesses and other dimensions of the various components making up the electronic devices described herein are not drawn to scale in the drawings.

Figure 2:
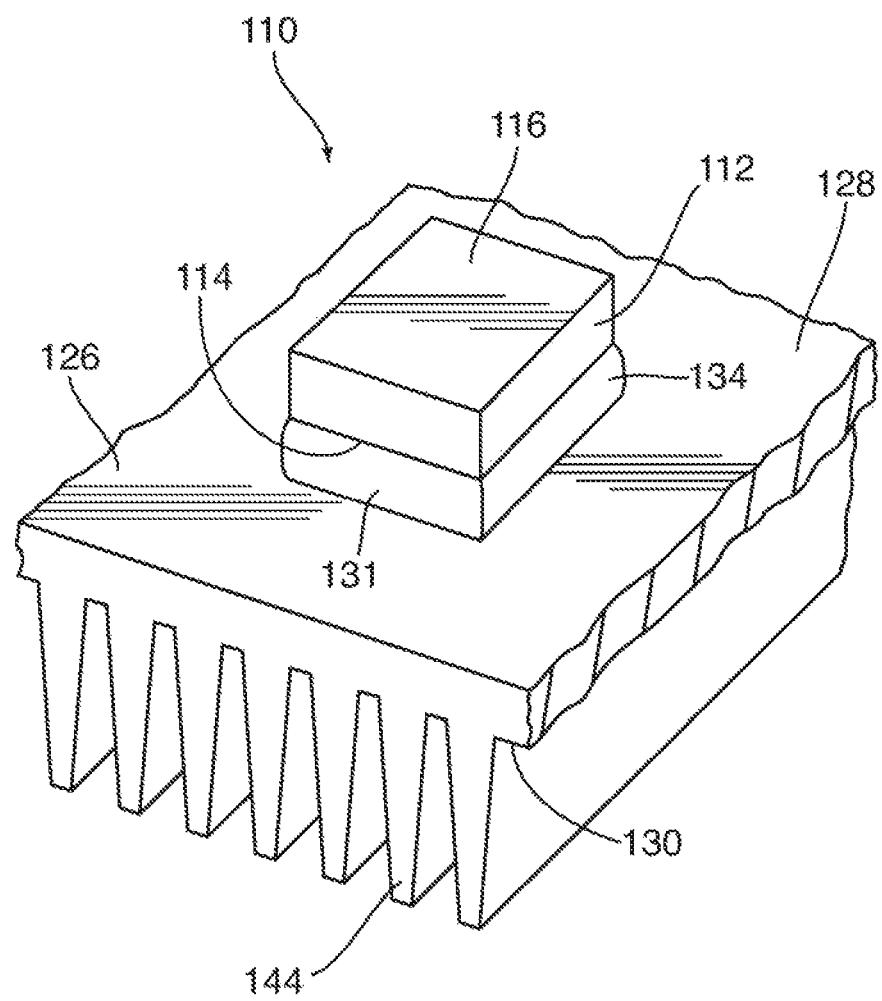
FIG. 2 is a view of the device of FIG. 1, with the circuit board removed.

FIGS. 1 and 2 schematically illustrate a portion of an electronic device 110 according to the prior art. Device 110 comprises a heat-generating electronic component 112 such as a computer chip, wherein the heat-generating electronic component 112 has a first surface 114 and a second surface 116. The heat-generating electronic component 112 is mounted on a circuit board 136, with its second surface 116 in proximity to the circuit board 136. The device 110 further comprises a heat sink 126 having a first surface 128 and a second surface 130. The heat sink 126 is comprised of metal or other thermally conductive material and is adapted to absorb and dissipate heat produced by the heat-generating electronic component 112. To assist in dissipating this heat, the outer surface 130 of heat sink 126 may be provided with cooling fins 144.

Heat is conducted across an interface 131 from the first surface 114 of the heat-generating electronic component 112 to the first surface 128 of the heat sink 126. A dielectric layer 134 of TIM is provided at the interface 131 between heat-generating electronic component 112 and heat sink 126. Heat generated by the heat-generating electronic component 112 is conducted through the TIM layer 134 to the heat sink 126, and is then conducted throughout the heat sink 126. This heat conduction is shown by arrows in FIG. 1. Although the vertical arrows in FIG. 1 may suggest that the heat flux of the heat-generating electronic component 112 is evenly distributed throughout its entire area, this is not necessarily the case. In fact, the heat-generating electronic component 112 may include hot spots in which the heat flux is higher than other parts of the component 112. The greater heat flux received from these hot spots may be concentrated in portions of the TIM layer 134 and interface 131, and these localized heat fluxes do not tend to spread evenly throughout the TIM layer 134.

It can also be seen from FIG. 1 that the heat absorbed by the heat sink 126 is conducted away from the area of the heat-generating electronic component 112 and spreads throughout the area of the heat sink 126. The heat is then transferred to the surrounding atmosphere through fins 144.

As mentioned above, the TIM layer 134 can enhance thermal contact between heat-generating electronic component 112 and heat sink 126 by filling gaps at the interface 131. However, excessive thickness of the TIM layer 134 can be detrimental to heat transfer, increasing thermal resistance and resulting in higher temperatures of the heat-generating electronic component 112.

The equation for simple conductive heat transfer through the TIM layer 134 is:

$$Q = k \times A \times dT/L$$

where: Q is the amount of heat transferred through TIM layer 134;

k is the thermal conductivity constant of the TIM;

A is the area of the TIM layer 134, and the area of the interface 131 between the heat-generating electronic component 112 and the heat sink 126;

dT is the temperature differential between the heat-generating electronic component 112 and the heat sink 126; and L is the length of the heat conduction path from the heat-generating electronic component 112 to the heat sink 126, i.e. the thickness of TIM layer 134.

For example, where Q=10 W; k=4 W/m$^2$K; A=12 mm×12 mm; and L=1 mm; the dT through the TIM layer 134 is greater than 17° C.

It can be seen from the above equation that the amount of heat transfer (Q) can be increased by reducing the thickness of the TIM layer 134 (L), because Q is inversely proportional to L. The thickness of the TIM layer can be reduced to less than about 1 mm, for example from about 0.1-0.5 mm.

It can also be seen that the amount of heat transfer (Q) can be increased by increasing the area (A) of the interface 131 between the heat-generating electronic component 112 and the heat sink 126, because Q is directly proportional to A. However, in the prior art construction of FIGS. 1 and 2, the area (A) of interface 131, and the area of TIM layer 134, are limited to the area of the heat-generating electronic component 112, which is typically very small.

Therefore, improvements in heat conduction in the prior art arrangement of FIGS. 1 and 2 are typically achieved by reducing the thickness (L) or improving the thermal conductivity (k) of the TIM layer 134.

Figure 3:
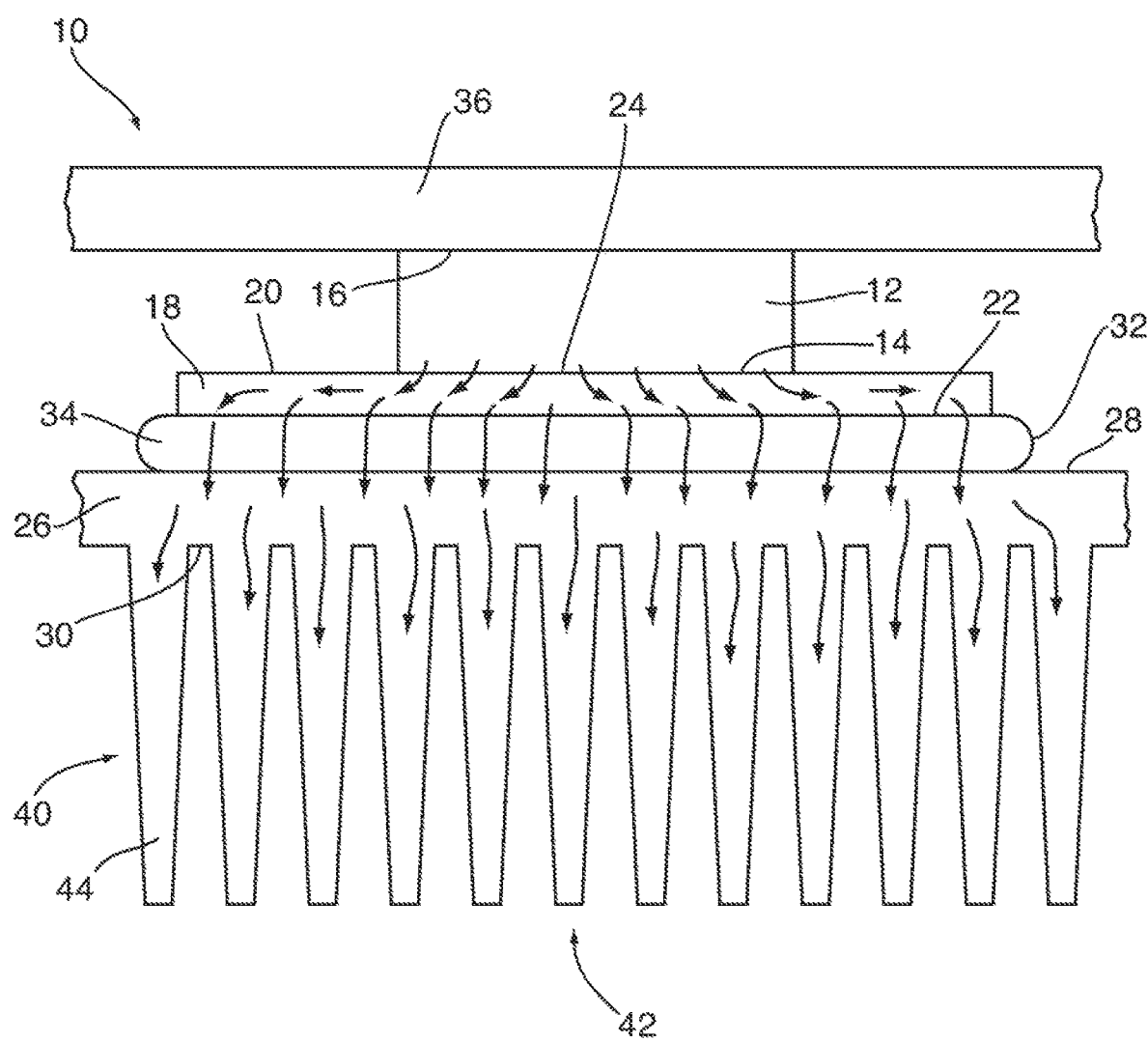
FIG. 3 is a schematic illustration of an electronic device according to a first embodiment.
Figure 4:
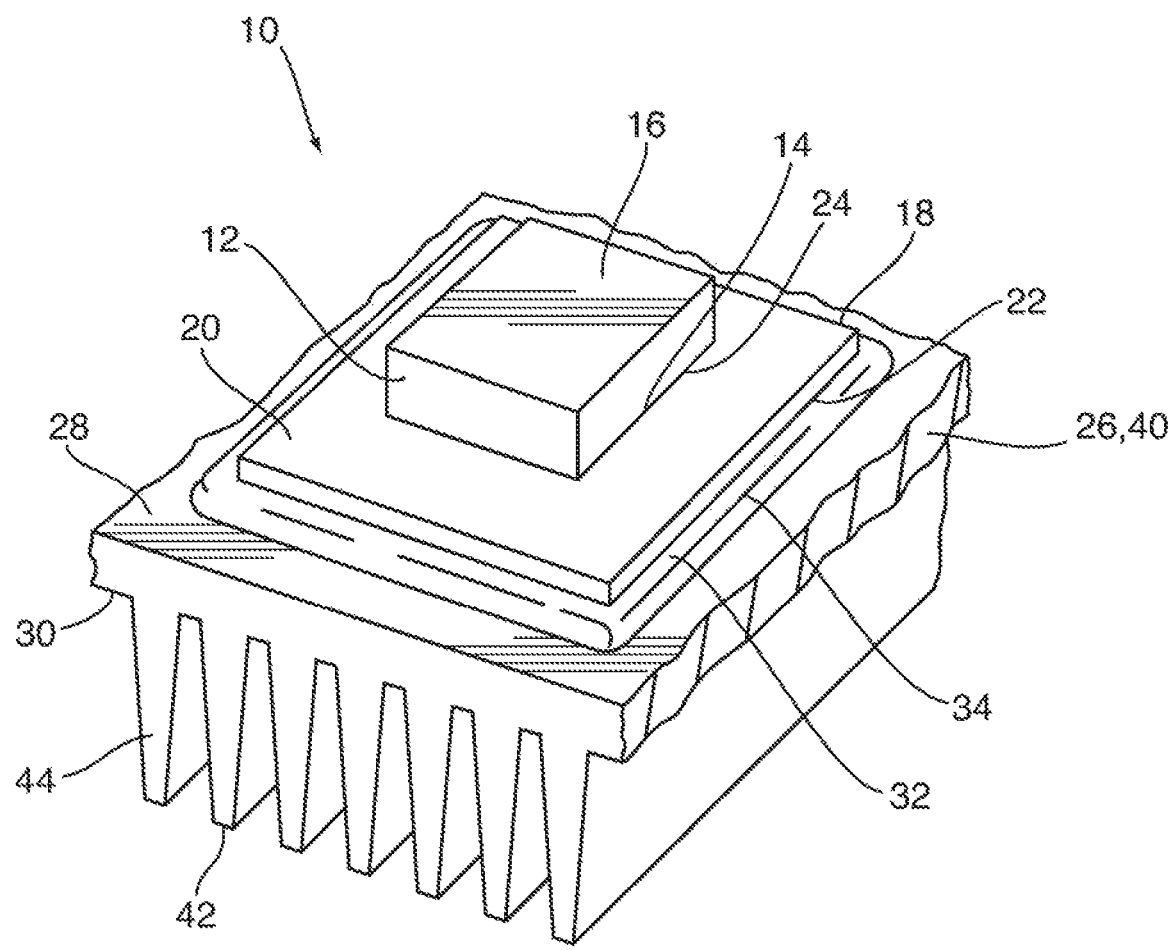
FIG. 4 is a view of the electronic device of FIG. 3, with the circuit board removed.

A first embodiment of an electronic device 10 is now described with reference to FIGS. 3 to 5. The electronic device 10 may comprise any type of computing device, including personal computers and computers integrated into other devices, systems or products, such as an onboard computer of a vehicle control system or entertainment system. Personal computers include smart phones, tablets, laptops and desktop computers.

The electronic device 10 includes a heat-generating electronic component 12 having a first surface 14 and an opposite second surface 16. The heat-generating electronic component 12 may comprise one or more computer chips, such as the computer chip for the CPU (central processing unit) or RAM (random access memory) of the electronic device 10. Alternatively, the heat-generating electronic component 12 may comprise a power electronics device which generates significant amounts of heat energy during use, such as a transistor, resistor, capacitor, field effect transistor (FET), isolated gate bipolar transistor (IGBT), power inverter, DC to DC converter, DC to AC converter or other electronic component such as an operational amplifier (op-amp). The heat-generating electronic component 12 is shown as being in the shape of a relatively flat rectangular prism, with the first and second surfaces 14, 16 being the major surfaces of component 12, having a square or rectangular shape, being opposed to one another, and also being flat and parallel to one another. This is for the purpose of illustration only, and it will be appreciated that the heat-generating electronic component 12 may have other shapes and dimensions.

Typically, where the heat-generating electronic component 12 is a computer chip, it may have an area of roughly 100-225 mm$^2$, this being the area of the first or second surface 14, 16. For example, where the first and second surfaces 14, 16 are square, they may have dimensions from about 10×10 mm$^2$ to about 15×15 mm$^2$, although computer chips having dimensions of 5×5 mm$^2$ or smaller are known.

The electronic device 10 includes a printed circuit board 36 through which the heat-generating electronic component 12 is electrically connected to other components (not shown) of the electronic device 10. The heat-generating electronic component 12 may be mounted in any suitable way to the printed circuit board 36. For example, the second surface 16 of heat-generating electronic component 12 may be secured to the circuit board 36 by adhesive or solder (not shown). The circuit board 36 is a poor conductor of heat.

The electronic device 10 further includes a heat spreader 18 and a heat sink 26. The heat spreader 18, which is further described below, has a first surface 20 and an opposite second surface 22. The first surface 20 of the heat spreader 18 is in thermal contact with the first surface 14 of the heat-generating electronic component 12 along a first interface 24, wherein the first interface 24 defines a first interface area A1 (FIG. 5). The first interface area A1 is substantially the same as the area of the heat-generating component 12, and substantially the same as the surface area of the first surface 14 of heat-generating electronic component 12, through which heat is transferred from the heat-generating electronic component 12 to the heat spreader 18. As used herein with reference to surface area, "substantially the same" means within ±15 percent.

The heat sink 26 has a first surface 28 and a second surface 30. The first surface 28 of the heat sink 26 is in thermal contact with the second surface 22 of the heat spreader 18 along a second interface 32. The second interface 32 defines a second interface area A2 (FIG. 5) which is greater than the first interface area A1, and greater than the area of the heat-generating electronic component 12.

The heat sink 26 has greater thickness, mass and area than the heat-generating electronic component 12, and is adapted to absorb, spread and dissipate the heat produced by the heat-generating electronic component 12 during use of the electronic device 10. The heat sink 26 has mass than the heat spreader 18, and optionally greater thickness and area than the heat spreader 18. The thickness of heat sink 26 is defined as the thickness of one or more layers of material between first and second surfaces 28, 30. The drawings show only a portion of the heat sink 26, however, the area of the heat sink 26 is greater than the area of the second surface 22 of the heat spreader 18, and greater than the second interface area A2. The heat sink 26 is comprised of a material having high thermal conductivity, such as a metal or a conductive non-metallic material. Suitable metals include copper and aluminum, including alloys thereof. Suitable non-metallic materials include graphite.

In some embodiments, the heat sink 26 may be located inside the electronic device 10. In other embodiments, the heat sink 26 comprises at least a portion of an external housing 40 of the electronic device 10, which is exposed to the atmosphere along its external surface 42. Also, the second surface 30 of the heat sink 26 may be provided with cooling fins 44 which at least partly define the external surface 42 of the housing 40. The fins 44 increase the surface area of external surface 42, to increase heat transfer from heat sink 26 to the atmosphere.

In the present embodiment, the first surface 14 of the heat-generating electronic component 12 is in thermal contact with the first surface 20 of the heat spreader 18, and may be in direct contact with the first surface 20 along the first interface 24. In some cases, there may be a thin layer of adhesive, solder or TIM at the first interface 24 to hold components 12 and 18 together, or they may be held together by spring force. The heat spreader 18 is comprised of a material having high thermal conductivity, such as a metal or a conductive non-metallic material. Suitable metals include copper and aluminum, including alloys thereof. Suitable non-metallic materials include graphite.

In the present embodiment, the heat spreader 18 has a flat, sheet or plate-like structure and may be thinner than the heat-generating electronic component 12, with the first and second surfaces 20, 22 being opposed to one another and defining the major surfaces of the heat spreader 18. Both surfaces 20, 22 have the same dimensions, such that both surfaces 20, 22 and the heat spreader 18 have surface area A2. Surface area A2 and the area of heat spreader 18 may be at least about 4 times, for example from about 5-100 times greater, than surface area A1 and the area of heat-generating electronic component 12. For example, in the drawings, surface area A2 may be about 4 times greater than surface area A1, with the length and width of the heat spreader 18 being approximately double the length and width of the heat-generating electronic component 12.

The heat spreader 18 may comprise a simple, flat sheet or plate comprised of metal or a conductive non-metallic material, which relies upon conduction through the plate to spread the heat transferred from the heat-generating electronic component 12, and which may have a thickness of about 50-2,000 micrometers. Alternatively, as further described below, the heat spreader 18 may comprise a heat pipe or vapor chamber having internal fluid (gas and liquid) flow passages.

Due to the intimate thermal contact between the heat-generating electronic component 12 and the heat spreader 18, and due to the partial or complete absence of a TIM layer at the first interface 24, there is little thermal resistance between these two components. Therefore, the heat spreader 18 effectively absorbs and spreads the heat produced by heat-generating electronic component 12 during use of the electronic device 10.

A layer 34 of dielectric TIM is provided at the second interface 32, i.e. between and in direct contact with the second surface 22 of heat spreader 18 and the first surface 28 of the heat sink 26, such that the second interface is dielectric. To provide the required dielectric strength at the second interface, the TIM has a thermal conductivity constant (k) of about 4 $W/m^2K$ or less. The area of the TIM layer 34 is substantially the same as the area A2 of the second interface 32 and the area of the heat spreader 18, and may have a thickness from about 0.1 mm to about 0.5 mm. The TIM layer 34 at the second interface 32 performs the same electrically insulating and gap filling function as the TIM layer 134 provided at interface 131 in FIGS. 1 and 2. Therefore, in the present embodiment, there is typically no need for a layer of a dielectric TIM at the first interface 24 between the heat-generating electronic component 12 and the heat spreader 18. Rather, high thermal conductivity is desired at the first interface 24, such that the first interface 24 is non-dielectric. Therefore, the TIM layer at first interface 24 may be completely eliminated. However, as mentioned above, it may be desired to provide a layer of a material with high thermal conductivity and low dielectric strength, such as a thermally conductive adhesive, solder or non-dielectric TIM at the first interface 24, which may be substantially thinner than TIM layer 34 at second interface 32, to adhere the heat-generating electronic component 12 to the heat spreader 18, and/or to account for any minor surface irregularities between the heat-generating electronic component 12 to the heat spreader 18. Such materials have a higher thermal conductivity constant than the TIM at the second interface, and typically greater than about 104 $W/m^2K$. Such a layer of adhesive, solder or TIM at the first interface 24 is sufficiently thin so that it does not significantly increase thermal resistance between the heat-generating electronic component 12 and the heat spreader 18, and that the TIM layer 34 at the second interface 32 provides the required electrical insulation and fills gaps resulting from manufacturing tolerances.

The above equation for simple conductive heat transfer applies equally to TIM layer 34 provided at second interface 32. In electronic device 10, the area of the TIM layer 34 is significantly greater than the area A of TIM layer 134 in prior art device 110, because it is not limited by the area of the heat-generating electronic component 12.

According to the above equation, the amount of heat transfer (Q) is directly proportional to the area of TIM layer 34 which, in electronic device 10, is substantially the same as area A2. The inventors have found that a four-fold increase in the area of TIM layer 34 can produce a significant reduction in temperature of the heat-generating electronic component 12, in some cases being up to about 20° C., particularly where the increase in area of the TIM layer 34 is coupled with a decrease in thickness of the TIM layer 34. For example, where Q=10 W; k=4 $W/m^2K$; A is increased by a factor of 4 from 100 $mm^2$ to 400 $mm^2$; and L is decreased from 1 mm to 0.5 mm; the dT through the TIM layer 134 was reduced from 25° C. to 3.1° C., and the temperature of the heat-generating electronic component 12 was reduced from 81.7° C. to 60.7° C.

Thus, in the electronic device 10 according to the first embodiment, the heat from heat-generating electronic component 12 is spread by the heat spreader 18 before passing through a TIM layer of area A2, whereas the prior art electronic device 110 passes the heat through a TIM layer of smaller area A1, before spreading the heat through heat sink 126. This is illustrated by arrows in FIG. 3.

Figure 6:
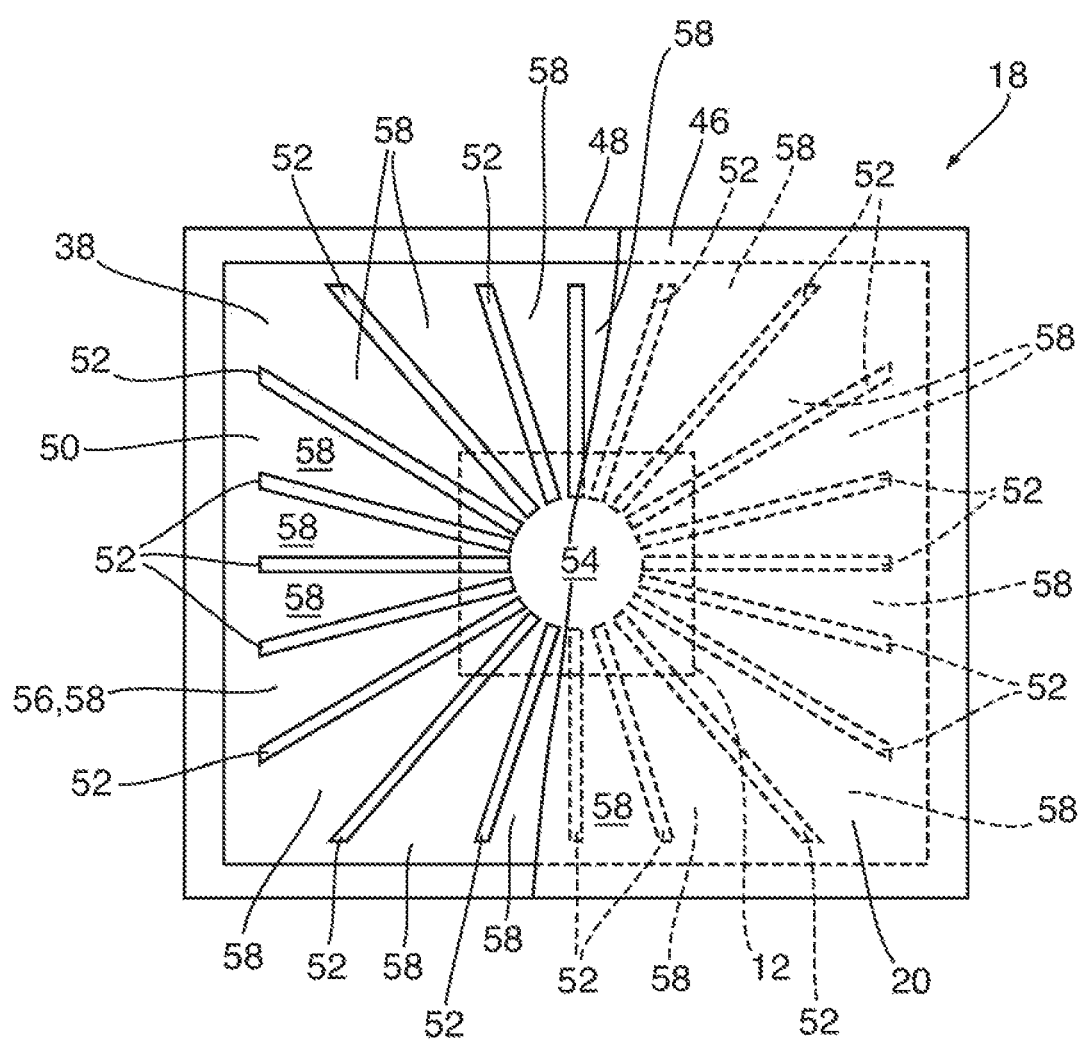
FIG. 6 is a partly cut-away plan view of an exemplary heat spreader of the electronic device of FIG. 3.

FIG. 6 is an exemplary heat spreader 18, in the form of a vapor chamber. The heat spreader 18 shown in FIG. 6, and may have a construction as disclosed in commonly assigned U.S. patent application Ser. No. 16/047,484, filed on Jul. 27, 2018 and entitled ULTRA THIN HEAT EXCHANGERS FOR THERMAL MANAGEMENT. In this regard, the heat spreader 18 is generally flat and planar and has a thickness ranging from about 200-2,000 micrometers. The heat-generating electronic component 12 is received on the heat spreader 18, and the outline of component 12 is shown as a square in dotted lines in FIG. 6.

The heat spreader 18 comprises two metal sheets, a first sheet 46 and a second sheet 48 which are sealingly joined together about their edges, for example by brazing or welding. A chamber 38 is enclosed between the sheets 46, 48 and contains a working fluid such as water. The chamber 38 contains a sheet of wick material 50 which may comprise a metal wire mesh. The wick material 50 includes a plurality of cutouts which define a plurality of gas flow passages 52 spaced apart across the area of the heat spreader 18.

Figure 5:
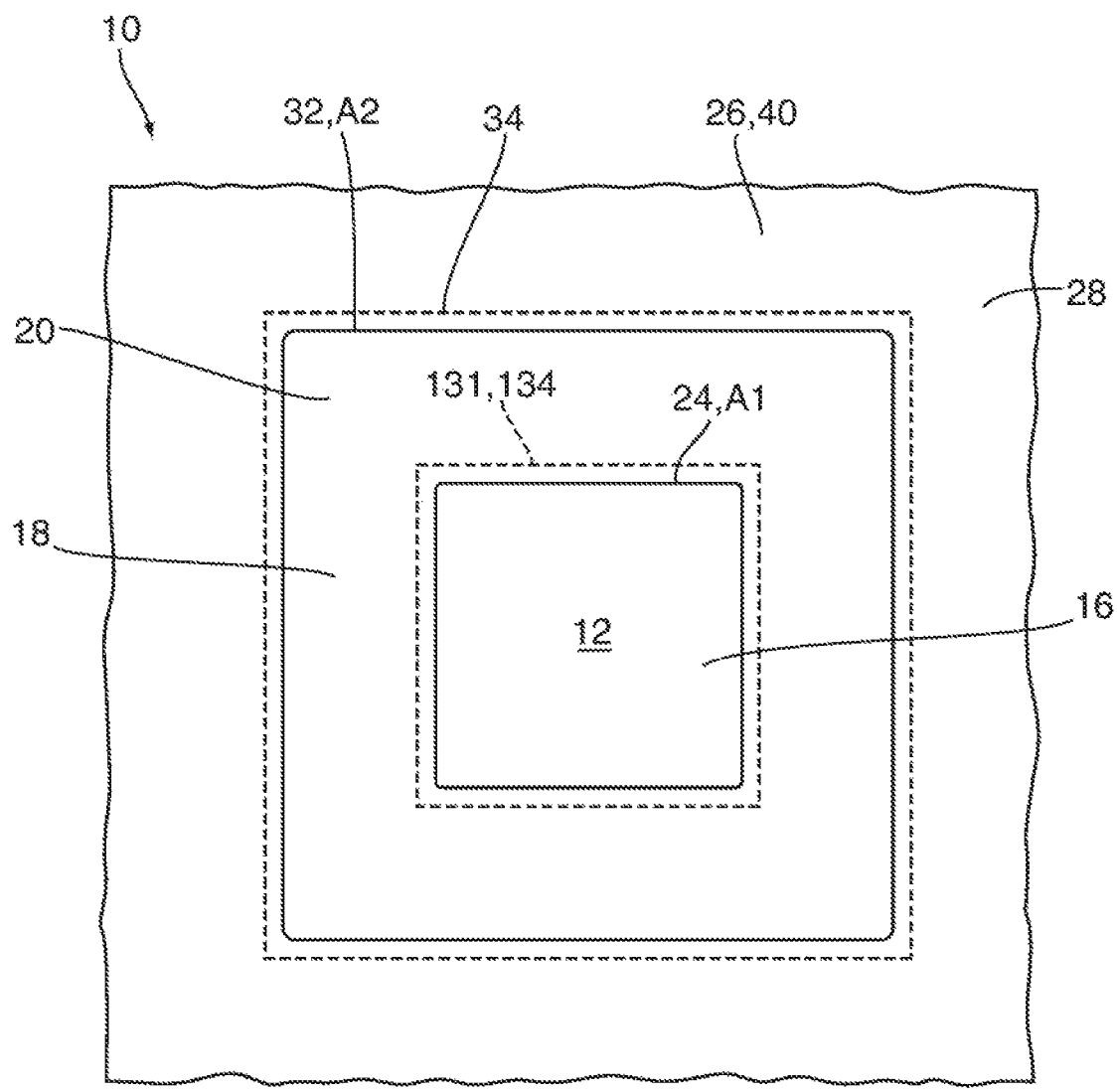
FIG. 5 is a plan view of the electronic device of FIG. 3, with the circuit board removed.

As shown in FIG. 5, the heat-generating electronic component 12 may be approximately centrally located on the first surface 20 of the heat spreader 18. With this arrangement, the gas flow passages 52 may radiate from the approximate center of the heat spreader 18 toward its outer peripheral edges. The central area of the heat spreader 18, which is in contact with the heat-generating electronic component 12 and which directly receives heat energy by conduction through first sheet 46, defines an evaporation zone 54 from which the gas flow passages 52 radiate. The working fluid is heated and vaporized in the evaporation zone 54, thereby absorbing heat energy from the heat-generating electronic component 12. The vaporized working fluid flows outwardly through gas flow passages 52 toward the outer peripheral edges of the heat spreader. The vaporized working fluid condenses in these outer areas, releasing heat energy and thereby spreading the heat throughout the area of heat spreader 18. The portions of the heat spreader 18 located outwardly of the heat-generating electronic component 12 therefore define a condensation zone 56.

The wick material 50 is hydrophilic and includes a large number of small voids within which capillary forces are generated. The condensed fluid is drawn into these voids and is circulated back to the evaporation zone 54 through the wick material, which defines a plurality of liquid flow passages 58.

An electronic device 60 according to a second embodiment is now described below with reference to FIGS. 7 and 8. Electronic device 60 may comprise any of the computing devices described above with reference to device 10, and includes a number of elements in common with electronic device 10. These like elements are identified with like reference numerals in the following description.

Electronic device 60 includes a heat-generating electronic component 12 having a first and second surfaces 14, 16, and which may comprise one or more computer chips, as described above. Heat-generating electronic component 12 of device 60 is identical to that of device 10, and therefore the above description of this element with regard to device 10 applies equally to device 60.

The electronic device 60 includes a printed circuit board 36 through which the heat-generating electronic component 12 is electrically connected to other components (not shown) of the electronic device 10. The heat-generating electronic component 12 may be secured to the circuit board 36 by adhesive or solder, as described above.

The electronic device 60 further includes a heat spreader 18 having first and second surfaces 20, 22, and a heat sink 26 having first and second surfaces 28, 30. The heat sink 26 of device 60 may be identical to that of device 10, and therefore the above description of heat sink 26 of device 10 applies equally to device 60.

The first surface 20 of heat spreader 18 is in thermal contact with the first surface 14 of the heat-generating electronic component 12 along a first interface 24 defining a first interface area A1. The first interface area A1 is substantially the same as the area of the heat-generating electronic component 12, and the surface area of the first surface 14 thereof. The first surface 28 of the heat sink 26 is in thermal contact with the second surface 22 of the heat spreader 18 along a second interface 32 defining a second interface area A2. As with device 10, the second interface area A2 is greater than the first interface area A1, and greater than the area of the heat-generating electronic component 12. For example, second interface area A2 may be at least about 4 times or about 5-100 times greater than interface area A1.

The heat spreader 18 is comprised of one or more layers of a material having high thermal conductivity, such as a metal or a conductive non-metallic material. Suitable metals include copper and aluminum, including alloys thereof, including materials including separate layers of aluminum and copper bonded together. Suitable non-metallic materials include graphite. The heat spreader 18 has a flat, plate-like structure with a first surface 20 on which the first interface 24 is defined and an opposite second surface 22 on which the second interface 32 is defined. However, in contrast to electronic device 10 described above, the first and second interfaces 24, 32 of electronic device 60 are not directly opposed to one another, but rather are spaced apart along an axis L which is parallel to the first interface 24.

The arrangement embodied by electronic device 60 is advantageous where the area surrounding heat-generating electronic component 12 is crowded with other components which prevent the insertion of a larger heat spreader 18 directly opposite to the heat-generating electronic component 12, as in device 10. In addition, the arrangement embodied by electronic device 60 permits conduction of heat away from the vicinity of the heat-generating electronic component 12.

The heat spreader 18 comprises a first portion 62 on which the first interface 24 is defined, a second portion 64 on which the second interface 32 is defined, and a connecting portion 66 which connects the first and second portions 62, 64. The second portion 64 has a larger area than the first portion 62. The first and second portions 62, 64 are both substantially flat and planar, and may be offset relative to one another, such that they lie in different planes. The connecting portion 66 extends between the planes defined by first and second portions 62, 64, and may be somewhat bendable. The flexibility of connecting portion 66 may be enhanced by making it narrower than one or both of the first and second portions 62, 64.

In some embodiments, thermal contact between the first surface 20 of heat spreader 18 and the first surface 14 of heat-generating electronic component 12 may be enhanced by providing a resilient member 68 between the second surface 22 of the heat spreader 18, in the first portion 62 thereof, and an adjacent surface of electronic device 60. In the present embodiment, the adjacent surface is the first surface 28 of heat sink 26. The resilient member 68 may be secured to one or both of heat spreader 18 and the adjacent surface by adhesive. The resilience of member 68 allows it to apply a compressive spring force to the heat spreader 18 and the heat-generating electronic component 12 at the first interface 24, the force being directed along an axis perpendicular to the first interface 24, to achieve better thermal contact and heat transfer between the heat spreader 18 and the heat-generating electronic component 12, and to adjust for any manufacturing tolerances. The compliance of connecting portion 66 permits some limited movement of the first portion 62 relative to heat-generating electronic component 12 without affecting the thermal contact between second portion 64 and the heat sink 26. The resilient member 68 comprises a layer of resilient dielectric material, such as rubber or synthetic elastomer which is provided between, and in compressive contact with, the second surface 22 of heat spreader 18 in the first portion 62 thereof, and the heat sink 26 of other adjacent surface of electronic device 60.

The TIM layer 34 is provided at the second interface 32, i.e. between the second surface 22 of heat spreader 18 and the first surface 28 of the heat sink 26, wherein the second surface 22 is provided in the second portion 64 of heat spreader 18. The area of the TIM layer 34 is substantially the same as the area A2 of the second interface 32 and the area of the second surface 22 of heat spreader 18. Area A2 is greater than the area A1 of the first interface 24, as discussed above.

The heat spreader 18 may comprise a plate comprised of metal or other thermally conductive material such as graphite, which relies upon conduction through the plate to spread heat from the heat-generating electronic component 12, to the first portion 62 of heat spreader 18, through the connecting portion 66 to the second portion 64.

Alternatively, as further described below, the heat spreader 18 may comprise a heat pipe or vapor chamber having internal fluid flow passages.

FIG. 8 shows an exemplary heat spreader 18 of electronic device 60, in the form of a vapor chamber. The heat spreader 18 of FIG. 8 comprises two metal sheets, a first sheet 46 and a second sheet 48 which are sealingly joined together about their edges, for example by brazing or welding. A chamber 38 is enclosed between the sheets 46, 48 and contains a working fluid such as water. The chamber 38 contains a sheet of wick material 50 which may comprise a metal wire mesh and which defines a plurality of liquid flow passages 58. The wick material 50 includes a plurality of cutouts which define a plurality of gas flow passages 52 spaced apart across the area of the heat spreader 18.

The evaporation zone 54 of heat spreader 18 of FIG. 8 is provided in the first portion 62, and the condensation zone 56 is located in the second portion 64. The gas flow passages 52 and the liquid flow passages 58 extend from the evaporation zone 54 to the condensation zone 56 through the connecting portion 66 of heat spreader 18.

While various embodiments have been described in connection with the present disclosure, it will be understood that certain adaptations and modifications of the described exemplary embodiments can be made as construed within the scope of the present disclosure. Therefore, the above discussed embodiments are considered to be illustrative and not restrictive.

What is claimed is:

1. An electronic device, comprising:
    (a) a heat-generating component having a first surface and an opposite second surface;
    (b) a heat spreader having a first surface and an opposite second surface, wherein the heat spreader has an area which is at least about 4 times greater than an area of the heat generating component, wherein the first surface of the heat spreader is in thermal contact with the first surface of the heat-generating component along a first interface, and wherein the first interface is non-dielectric and defines a first interface area;
    (c) a heat sink having a first surface and an opposite second surface, wherein the heat sink has a greater mass than the heat spreader and comprises one or more layers of thermally conductive metal or non-metal between the first and second surfaces of the heat sink, wherein the first surface of the heat sink is in thermal contact with the second surface of the heat spreader along a second interface, wherein the second interface defines a second interface area which is greater than the first interface area; and
    (d) a layer of a dielectric TIM (thermal interface material) provided at the second interface and in direct contact with the second surface of the heat spreader and the first surface of the heat sink, wherein the second interface is dielectric;
    wherein the first and second interfaces are spaced apart along an axis which is parallel to the first interface; and
    wherein the heat spreader comprises a first portion on which the first interface is defined, a second portion on which the second interface is defined, and a connecting portion which extends between and connects the first and second portions, wherein the second portion has an area which is greater than an area of the first portion.

2. The electronic device of claim 1, wherein the heat sink has a greater area than the heat spreader, and a greater thickness, mass and area than the heat-generating component.

3. The electronic device of claim 1, wherein the heat-generating component is a heat-generating electronic component, wherein the second surface of the heat-generating component faces toward a circuit board on which the heat-generating component is mounted.

4. The electronic device of claim 1, wherein the first surface of the heat-generating component is flat, and wherein the area of the heat-generating component is substantially the same as the first interface area.

5. The electronic device of claim 1, wherein the area of the heat spreader is about 5-100 times greater than the area of the heat-generating component.

6. The electronic device of claim 1, wherein the first surface of the heat-generating component is in direct contact with the first surface of the heat spreader along said first interface, without any TIM being provided at the first interface.

7. The electronic device of claim 1, wherein a layer of a material with high thermal conductivity and low dielectric strength is provided at the first interface.

8. The electronic device of claim 1, wherein the layer of TIM at the second interface has a thickness from about 0.1 mm to about 0.5 mm.

9. The electronic device of claim 1, wherein the heat spreader comprises a sheet or plate comprising one or more layers of thermally conductive metal or non-metal.

10. The electronic device of claim 9, wherein the thermally conductive metal is aluminum or copper, and the thermally conductive non-metal is graphite.

11. The electronic device of claim 1, wherein the heat spreader comprises a vapor chamber or a heat pipe.

12. The electronic device of claim 1, wherein the heat spreader has a thickness of about 50-2,000 micrometers.

13. The electronic device of claim 1, wherein the heat sink comprises at least a portion of a housing of the electronic device.

14. The electronic device of claim 1, wherein the second surface of the heat sink comprises an external surface of the electronic device.

15. The electronic device of claim 1, wherein the second surface of the heat sink is provided with a plurality of cooling fins.

16. The electronic device of claim 1, wherein the first and second portions of the heat spreader are offset relative to one another along an axis which is perpendicular to the first interface, such that they are located in different planes.

17. The electronic device of claim 1, further comprising a resilient member which exerts a compressive force to the heat-generating component and the first portion of the heat spreader at the first interface, wherein the compressive force is directed along an axis which is perpendicular to the first interface.

18. The electronic device of claim 17, wherein the resilient member comprises a layer of a resilient dielectric material which is provided between, and in compressive contact with, the second surface of the heat spreader in the first portion thereof, and an adjacent surface of the electronic device.

* * * * *